United States Patent [19]
Thornton

[11] Patent Number: 5,337,074
[45] Date of Patent: * Aug. 9, 1994

[54] OPTO-ELECTRONIC LINE PRINTER HAVING A HIGH DENSITY, INDEPENDENTLY ADDRESSABLE, SURFACE EMITTING SEMICONDUCTOOR LASER/LIGHT EMITTING DOIDE ARRAY

[75] Inventor: Robert L. Thornton, East Palo Alto, Calif.

[73] Assignee: Xerox Corporation, Stamford, Conn.

[*] Notice: The portion of the term of this patent subsequent to Oct. 29, 2008 has been disclaimed.

[21] Appl. No.: 740,237

[22] Filed: Aug. 5, 1991

Related U.S. Application Data

[63] Continuation-in-part of Ser. No. 636,524, Dec. 28, 1990, Pat. No. 5,062,115.

[51] Int. Cl.⁵ .................... B41J 2/45; B41J 2/455
[52] U.S. Cl. ........................................ 346/107 R
[58] Field of Search ............... 346/107 R, 108, 76 L; 372/50, 45, 46; 357/17; 257/88, 93

[56] References Cited

U.S. PATENT DOCUMENTS

| | | | |
|---|---|---|---|
| 4,135,207 | 1/1979 | Greve et al. | 358/128 |
| 4,706,255 | 11/1987 | Thornton et al. | 372/50 |
| 4,727,557 | 2/1988 | Burnham et al. | 372/50 |
| 4,804,975 | 2/1989 | Yip | 346/76 L |
| 4,831,629 | 5/1989 | Paoli et al. | 372/50 |
| 4,870,652 | 9/1989 | Thornton | 372/50 |
| 4,987,468 | 1/1991 | Thornton | 372/45 X |
| 5,034,958 | 7/1991 | Kwon et al. | 372/45 |
| 5,062,115 | 10/1991 | Thornton | 372/50 |
| 5,068,868 | 11/1991 | Deppe et al. | 372/45 |
| 5,160,965 | 11/1992 | Koide | 346/107 R X |
| 5,170,180 | 12/1992 | Doi | 346/107 R |

Primary Examiner—Benjamin R. Fuller
Assistant Examiner—David Yockey
Attorney, Agent, or Firm—William Propp

[57] ABSTRACT

A high density surface emitting semiconductor LED or laser array is coupled with a driver circuit substrate for modulating the light emitted from the array. This modulated light is imaged by optical means onto a photosensitive recording medium of an opto-electronic line printer. The imaging optical means can be either a single or multiple lens system.

12 Claims, 11 Drawing Sheets

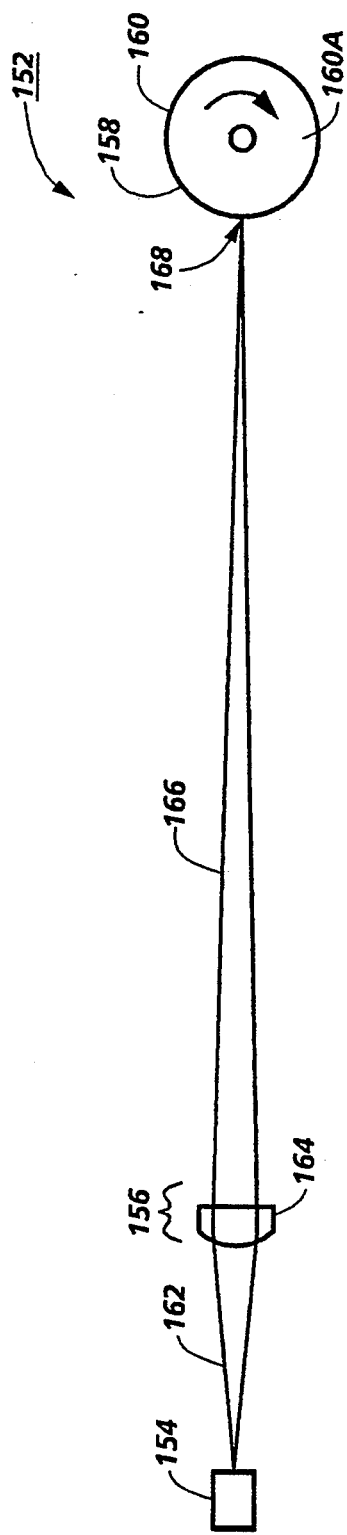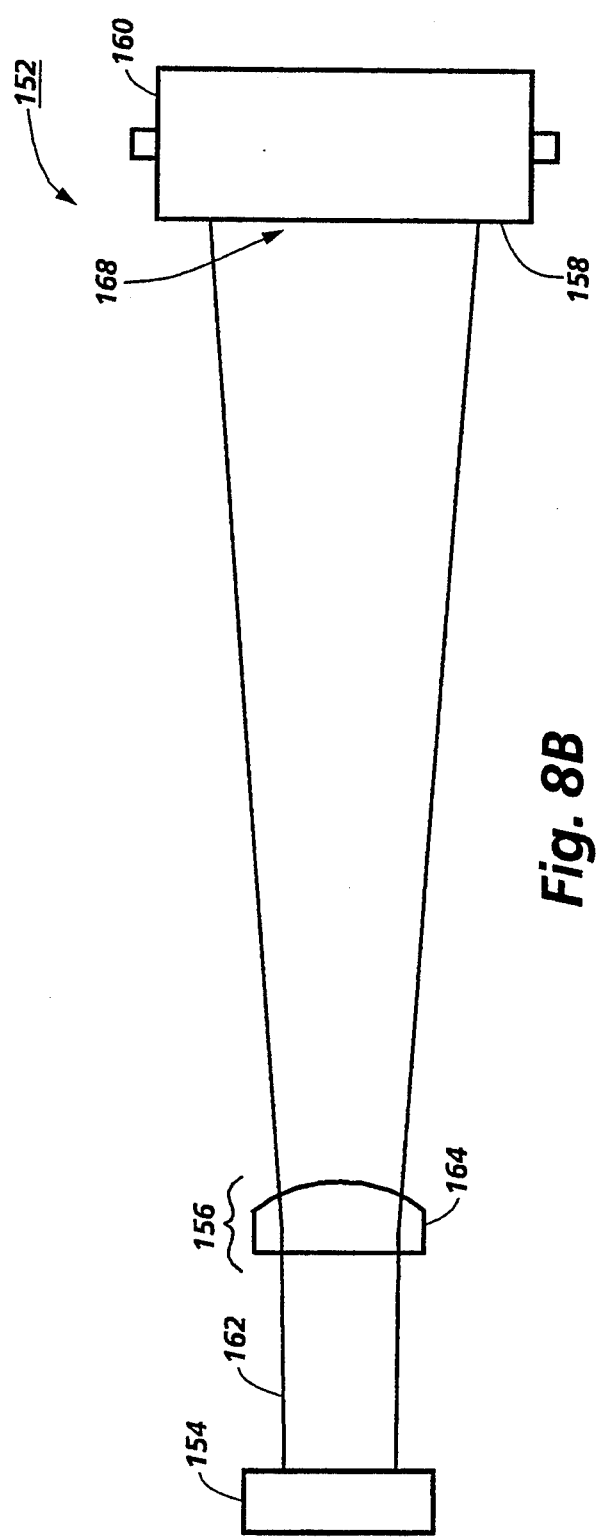

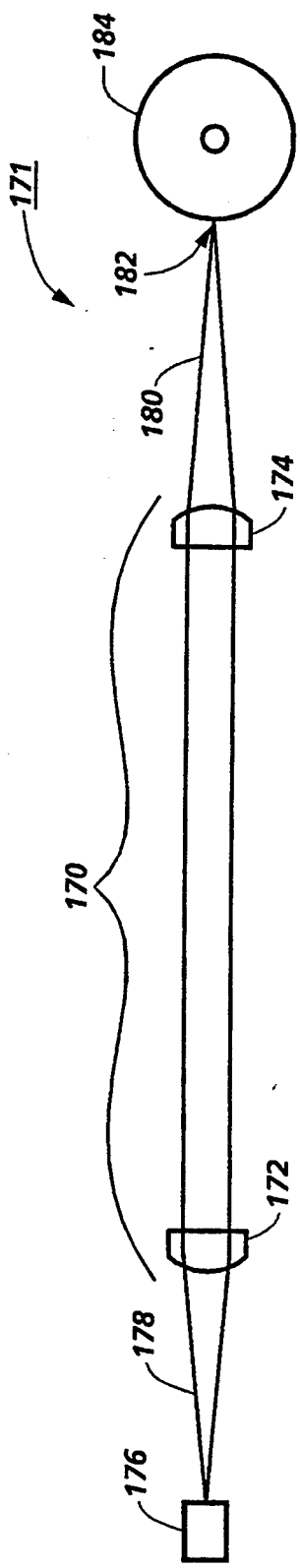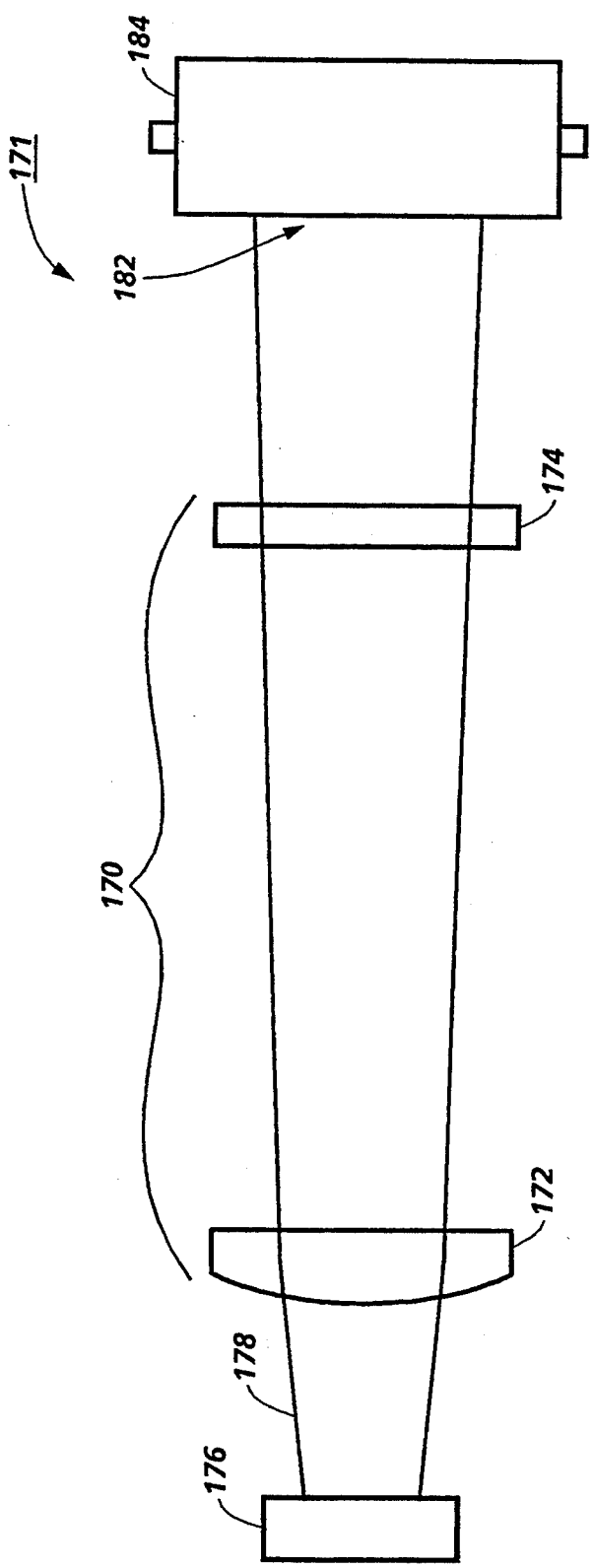
Fig. 9A
Fig. 9B

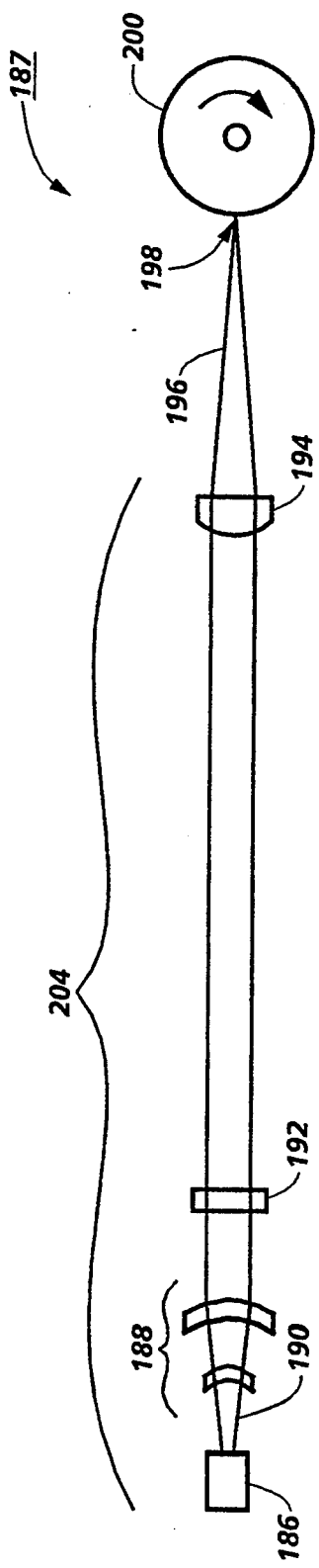
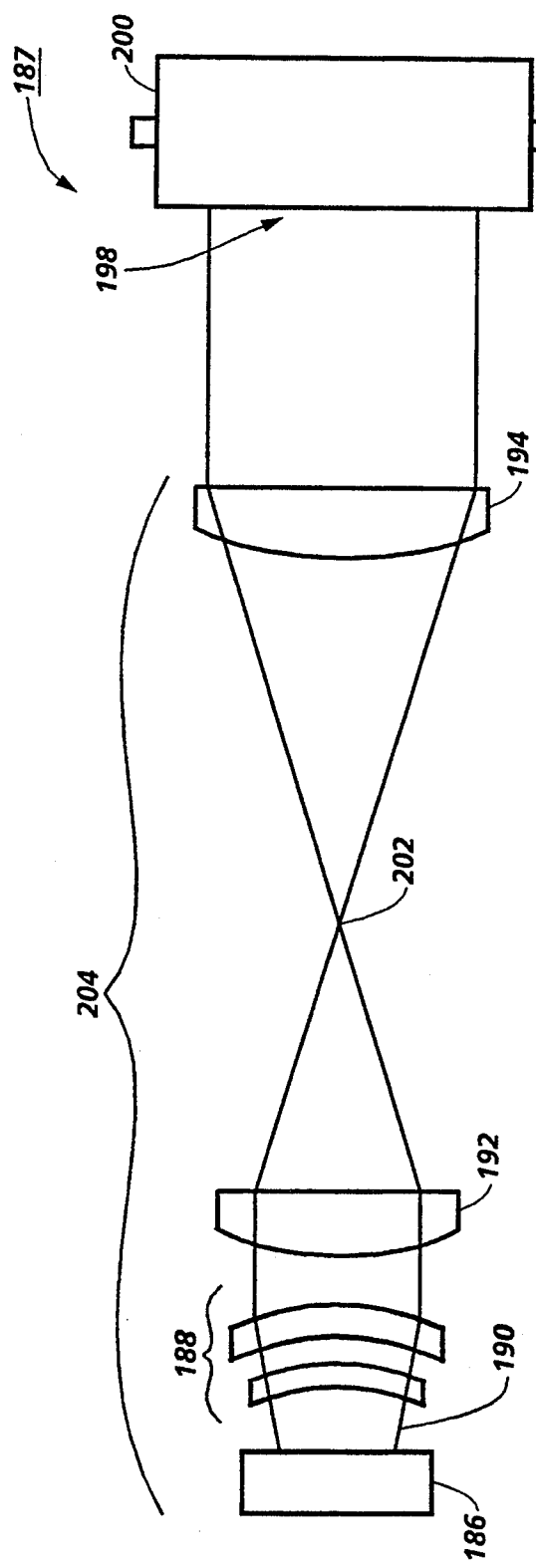

OPTO-ELECTRONIC LINE PRINTER HAVING A HIGH DENSITY, INDEPENDENTLY ADDRESSABLE, SURFACE EMITTING SEMICONDUCTOOR LASER/LIGHT EMITTING DOIDE ARRAY

This is a continuation-in-part of application, Ser. No. 07/636,524, filed Dec. 28, 1990, now U.S. Pat. No. 5,062,115, granted Oct. 29, 1991.

BACKGROUND OF THE INVENTION

This invention relates to a surface emitting semiconductor laser/light emitting diode structure and, more particularly, to a high density, surface emitting semiconductor laser/light emitting diode structure with independently addressable individual light emitting elements which are highly adaptable for use as modulated illuminating sources for opto-electronic line printers.

In the prior art, semiconductor lasers and light emitting diodes (LEDs) have been employed as a light source to produce an image on a photosensitive medium such as a xerographic photoreceptor used in a xerographic printer. In this kind of application, there is a need for uniformity of the intensity of light in the image as well as sufficient intensity of the light emitted. Further, if LEDs have to be utilized, it is necessary to provide a full width array of LEDs, one per picture element or pixel, so that a line of light can be formed for discharge of the photoreceptor in an image-wise manner. Usually, a plurality of light emitting device arrays are arranged in one or more rows and optical means is positioned between the photosensitive medium and the light source array to focus the light from the array sources to a single line on the surface of the photosensitive medium. The light sources are selectively turned on and off to effect line-by-line exposure of the moving photosensitive medium.

Semiconductor lasers have also been used in the past as such light sources for rotating polygon scanned printers because of their high intensity in a focussed spot. They have not, however, been totally best suited for application in electro-optic line printers due to inadequate power and inadequate uniformity of light intensity. In particular, high-power coherent laser sources possess a far field pattern containing regions of high intensity and of low intensity in the single beam far field, i.e., the far field pattern is not uniform. Such a variation in intensity across the beam output is not desired because the line exposure on the photosensitive medium will not be uniform. For this and other reasons, LEDs have been more favored as a light source for electro-optic line printers because they may be designed to provide a light output of monotonically varying intensity with very short coherence length.

In some cases, LEDs in the past have not provided sufficient output power and intensity to accomplish in an efficient manner the task of exposing a charged and moving photosensitive medium. In addition, an LED is much less efficient than a laser. For this reason, LEDs as light sources for xerographic photoreceptor applications have lacked the output intensity level for good photoreceptor discharge and, as a result, semiconductor lasers have been still favored in many cases as the light source for printer applications.

Beside the problem of sufficiency of LED intensity, the maintenance of light output uniformity among a plurality of LEDs as well as a multiple laser source, as alluded to above, is a recognized problem in the art. To insure that the intensity of the broad light emission from the array is uniform across an LED array, elaborate control systems have been designed to provide for light intensity uniformity as exemplified, for example, in U.S. Pat. No. 4,455,562. This patent utilizes a binary weighted duty cycle control to obtain substantial uniformity in the light emitted from each LED in the array of LEDs.

The highest power LEDs have been surface emitter types, but they lack power density necessary for most printer applications. i.e., they lack from sufficient light density per aperture size.

A most recent advancement in the printer arts has been the concept of a total internal reflection (TIR) line modulator which is a solid state multigate light valve that may be used to address a photosensitive medium. The light TIR modulator comprises a crystal bar of electro-optic material with an array of interdigital electrodes deposited on one of its major surfaces. These electrodes, when electrically addressed, introduce or induce a periodic electric field into the bulk crystal. Each of the electrodes may be individually addressed by an electronic signal forming a signal pattern across the array. A broad or wide sheetlike beam of high intensity light is required for the line modulator. The beam is introduced into the crystal at an angle incident to the plane of the major surface incorporating the electrodes. An example of the TIR line modulator is disclosed in U.S. Pat. No. 4,281,904 to Robert A. Sprague et al.

To carry out the exposure process of the photosensitive medium, a sheetlike beam of light is transmitted through the electro-optic element of the TIR line modulation at a slight angle relative to the optical axis of the light to cause total internal reflection at the internal surface incorporating the electrode array. Successive sets of digital bits or analog samples. representing respective collections of picture elements or pixels for successive lines of an image, are sequentially applied to the electrode array. Localized electric bulk or fringe fields developed in the crystal in proximity to the TIR incidence of light modulate the light and change the phase front of the sheetlike light beam in image-wise configuration onto the charged photosensitive medium. Examples and teachings relative to electro-optic line printer applications may be found in U.S. Pat. Nos. 4,367,925; 4,369,457; 4,370,029; 4,437,106; 4,450,459: 4,480,899 and 4,483,596.

More recently, a super luminescent LED side-facet source has been developed for electro-optic line modulation and line printers which is characterized by having high output intensity and a uniform far field emission and optical means to collimate the far field emission in the tangential direction and focus the near field in the sagittal direction onto a TIR modulator. The optical means comprises a first lens system to collect the light emitted from the LED source in both the tangential and sagittal directions and a second toric lens to collimate the light into a sheetlike beam in the tangential direction and to focus the light in the sagittal direction to a line image at the modulator. Imaging means are optically aligned between the modulator and the recording medium for imaging the modulator onto the recording medium of a line printer. In this connection, see U.S. Pat. Nos. 4,638,334 and 4,730,331.

An incoherent, optically uncoupled laser array can provide a uniform high intensity light for a TIR modulator used with an electro-optic line printer. An example of the TIR line modulator is disclosed in U.S. Pat. No. 4,876,918 to Robert L. Thornton et al.

However, the use of TIR modulators in electro-optic line printers presents several inherent problems. A physical distance exists between the light emission source and the modulator for the emitted light which reduces the efficiency of such devices. The emitted light must strike the TIR modulator at a grazing angle to be modulated. The light emission element, the modulating element and the recording medium are off-axis relative to one another which makes the precise alignment of these elements more critical. The light emission and light modulation functions are separate which increases the number, complexity, and expense of the components of the line printer system.

It is an object of this invention, therefore, to provide a high density, surface emitting semiconductor laser/-light emitting diode structure with independently addressable individual light emitting elements which are highly adaptable for use as modulated illuminating sources for opto-electronic line printers.

It is another object of this invention to provide an opto-electronic line printer which does not require either a TIR modulator or collimated light beams.

It is yet another object of this invention to provide an opto-electronic line printer which combines the light emission and light modulation functions in a modulated array.

SUMMARY OF THE INVENTION

In accordance with the present invention, a high density surface emitting semiconductor LED or laser array is coupled with a driver circuit substrate for modulating the light emitted from the array. This modulated light is imaged by optical means onto a photosensitive recording medium of an opto-electronic line printer. The imaging optical means can be either a single or multiple lens system.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 8A is a schematic illustration in the sagittal direction of an opto-electronic line printer with imaging optics for collecting, magnifying and focusing the emitted light beam from a modulated array for printing an image on a photosensitive recording medium formed according to this invention.

FIG. 8B is a schematic illustration in the tangential direction of the embodiment of the opto-electronic line printer of FIG. 8A.

FIG. 9A is a schematic illustration in the sagittal direction of an opto-electronic line printer with an alternate embodiment of the imaging optics for collecting, magnifying and focusing the emitted light beam from a modulated array for printing an image on a photosensitive recording medium formed according to this invention.

FIG. 9B is a schematic illustration in the tangential direction of the embodiment of the opto-electronic line printer of FIG. 9A.

FIG. 10A is a schematic illustration in the sagittal direction of an opto-electronic line printer with another alternate embodiment of the imaging optics for collecting, magnifying and focusing the emitted light beam from a modulated array for printing an image on a photosensitive recording medium formed according to this invention.

FIG. 10B is a schematic illustration in the tangential direction of the embodiment of the opto-electronic line printer of FIG. 10A.

DESCRIPTION OF THE PREFERRED EMBODIMENT

Figure 1:
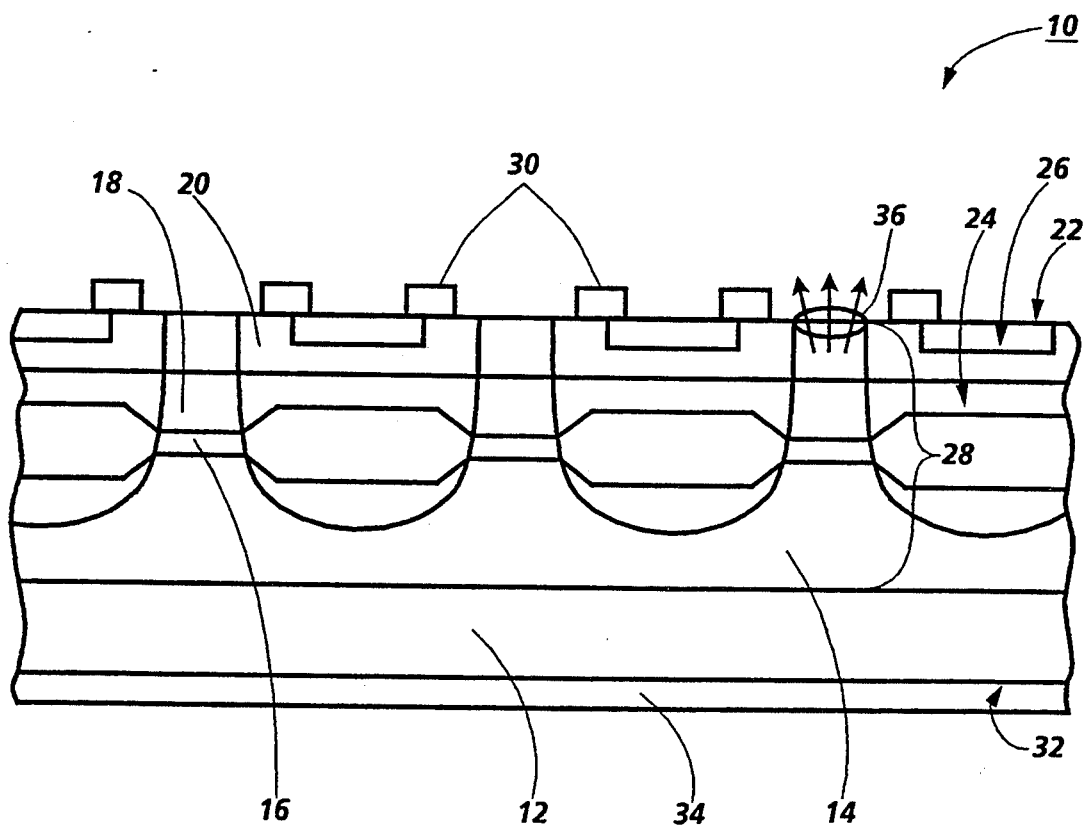
FIG. 1 is a schematic illustration of a side view of a high density, independently addressable, surface emitting, semiconductor LED array formed according to this invention.

Reference is now made to FIG. 1, wherein there is illustrated a high density, independently addressable, surface emitting, semiconductor light emitting diode (LED) array 10 of this invention.

LED array 10 comprises a substrate 12 of n-GaAs upon which is epitaxially deposited a first confinement layer 14 of n-$Al_xGa_{1-x}$As; an active layer 16 of non-doped GaAs for providing light wave generation and propagation, a second confinement layer 18 of p-$Al_yGa_{1-y}$As where x= or y and a contact layer 20 of p-GaAs. The semiconductor material of the active layer 16 should have a narrow bandgap while the semiconductor material of the confinement layers 14 and 18 should have a wide bandgap. The second confinement layer 18 and the contact layer 20 should also have a doping level as low as possible without introducing unnecessary resistance so that the layers are transparent to the light generated in the active layer. The substrate, on the other hand, should be heavily doped to increase electrical conductivity.

Since the second confinement layer 18 and the contact layer 20 are both p-type conductivity, that side of the LED array from the active layer is referred to as the p-side of the LED array. Similarly, since the first confinement layer 14 and the substrate 12 are both n-type conductivity, that side of the LED array from the active layer is referred to as the n-side of the LED array.

The active layer may, in the alternative, be nondoped or p-type doped or n-type doped; GaAs, $Al_yGa_{1-y}As$ or $(Al_xGa_{1-x})_{0.5}In_{0.5}P$; or a relatively thin conventional double heterostructure (DH) active layer; or a single quantum well, such as GaAs or $Al_yGa_{1-y}As$ where y is very small and $y<x$; or a multiple quantum well superlattice, such as alternating layers of GaAs and $Al_yGa_{1-y}As$ where $y<x$ or alternating layers of $Al_wGa_{1-w}As$ and $Al_BGa_{1-B}As$ where $B<w<x$ with a second confinement layer 18 of $p-Al_zGa_{1-z}As$ where $B<w<z$; or a separate single or multiple quantum well structure in a separate confinement cavity.

As is known in the art, the epitaxial growth of LED array 10 may be carried out by molecular beam epitaxy (MBE) or metalorganic chemical vapor deposition (MOCVD). The substrate 12 may be 100 microns thick. Confinement layers 14 and 18 may each have a thickness in the range of 0.1 to 1 micron. Active layer 16 may be a thin conventional layer having a thickness of 50 to 300 nanometers or may be comprised of a superlattice structure of quantum wells which may be 3 to 50 nanometers thick. Contact layer 20 may have a thickness in the range of 100 to 1000 angstroms.

There are alternate conventional techniques and diffusion/implant species for carrying out the desired disordering or the elemental implant/annealing technique. Discussion hereafter will be confined to impurity induced disordering. However, it should be noted that these other techniques and elemental diffusions or implants are equally applicable.

Upon completion of the epitaxial growth, a $Si_3N_4$ mask is formed on the top surface 22 of the contact layer 20 with openings exposing regions of the semiconductor structure to impurity induced disordering. The mask protects the unexposed regions which will form the LED which can be circular, elliptical, square, parallelogramal, trapezoidal, triangular or any desired shape or size.

The light emitting areas are established by first selectively diffusing a high concentration n-impurity dopant, such as silicon, into the regions of the semiconductor structure exposed through the mask. Other n-impurity dopant elements would include Ge and Sn.

A silicon layer is deposited in the opening in the $Si_3N_4$ mask and then capped with an additional layer of $Si_3N_4$. The diffusion of silicon is accomplished at a temperature of approximately 850° C. and is maintained for a sufficiently long period of time, e.g. seven to eight hours, to penetrate contact layer 20, second confinement layer 18 and active layer 16 and partially penetrate first confinement layer 14.

The diffusion of silicon through the contact layer 20 of p-GaAs into the active layer 16 and the confinement layers 14 and 18 causes an intermixing of Ga and Al in the active layer 16 as well as the confinement layers 14 and 18, thereby forming a n-impurity induced disordered region 24. The processing of the LED array is done from just one side, the p-side, of the LED array.

Upon completion of the impurity induced disordering steps, electrically insulating regions 26 are formed in the disordered regions 24 by proton implantation through the top surface 22 to provide a level of electrical isolation of the LED light emitting areas which allows independent addressability of each individual light emitting area.

Between the disordered regions 24 in the semiconductor LED array are the LED light emitting areas 28 consisting of the nondisordered sections of the contact layer 20, second confinement layer 18, the active layer 16 and the first confinement layer 14. The disordered regions, optically and electrically, isolate and separate the light emitting areas. The light emitting areas are shaped by the confinement layers in the vertical direction and the shape of the disordered regions in the horizontal direction.

Standard chemical etching means or other techniques are employed to form metal contacts 30 of Cr—Au or Ti—Pt—Au on the top surface 22 of contact layer 20. Each contact is aligned with each disordered region 24. Each contact is either partially aligned or not aligned with the electrically insulating regions 26 of each disordered region. In the Figure, the contacts are annular in shape, but shown in cross-section, circumscribing the nondisordered contact layer 20 and the LED light emitting area 28 beneath. The contacts 30 are referred to as p-contacts since they are on the p-side of the LED array.

The bottom surface 32 of the substrate 12 is also metallized with alloyed Au—Ge, followed by Cr—Au or Ti—Pt—Au, to form a substrate contact 34. The substrate contact covers the entire bottom surface of the substrate under all of the disordered regions and is referenced to ground. The substrate contact 34 is referred to as the n-contact since it is on the n-side of the LED array.

Current is injected between the p-contact 30 and the n-contact 34 to forward-bias the p-n junction of p-confinement layer 18 and n-confinement layer 14 to cause the active layer 16 to emit light 36 from the light emitting area 28. The current is injected substantially parallel to the LED light emitting area, through the p-contact 30, the p-contact layer 20, p-confinement layer 18, active layer 16 of the individual light emitting area, and then spreads in the n-confinement layer 14 into the substrate 12 and out the n-contact 34.

The ground or n-contact is common to all the light emitting areas. However, each light emitting area or LED element contains a p-n junction that is separately biased through its p-contact from all the others. Since each p-contact is positively biased with respect to ground, current flows only from each p-contact to ground. The electrically isolating regions and the disordered regions prevents any single p-contact from causing adjacent light emitting areas to emit light. Flow between different p-contacts does not occur because any small potential difference between the addressed p-contact and a neighboring p-contact corresponds to a reverse voltage on the neighboring p-contact.

The light is emitted through the emitter surface area 36, substantially perpendicular to the top surface 22 of the contact layer 20, hence LED array 10 is a surface emitting LED. The thickness of the substrate 12 and the substrate contact 30 prevent light from being emitted by the optical cavity through the n-side of the LED array.

The shape of the emitter surface area and the resulting emitted light is determined by the shape of the LED light emitting areas which can be circular, elliptical, square, parallelogramal, trapezoidal, triangular or any desired shape or size. In the present Figure, although shown in cross-section the emitter surface areas are circular circumscribed by the annular p-contact. The emitted light itself can be either continuous wave or pulse.

Typically, the LED array 10 has an operating current of about 10 milliamperes with an output power of about 30 microwatts per individual light emitting element.

The p-GaAs contact layer 20 may be removed by chemical etching or other means from the emitter surface area 36 of the LED light emitting area exposing the second confinement layer 18 therebeneath to facilitate light emission. The emitter surface area can be coated with an antireflective coating, such as a thin (30 nanometer) layer of $Al_2O_3$ to facilitate light emission.

Figure 2:
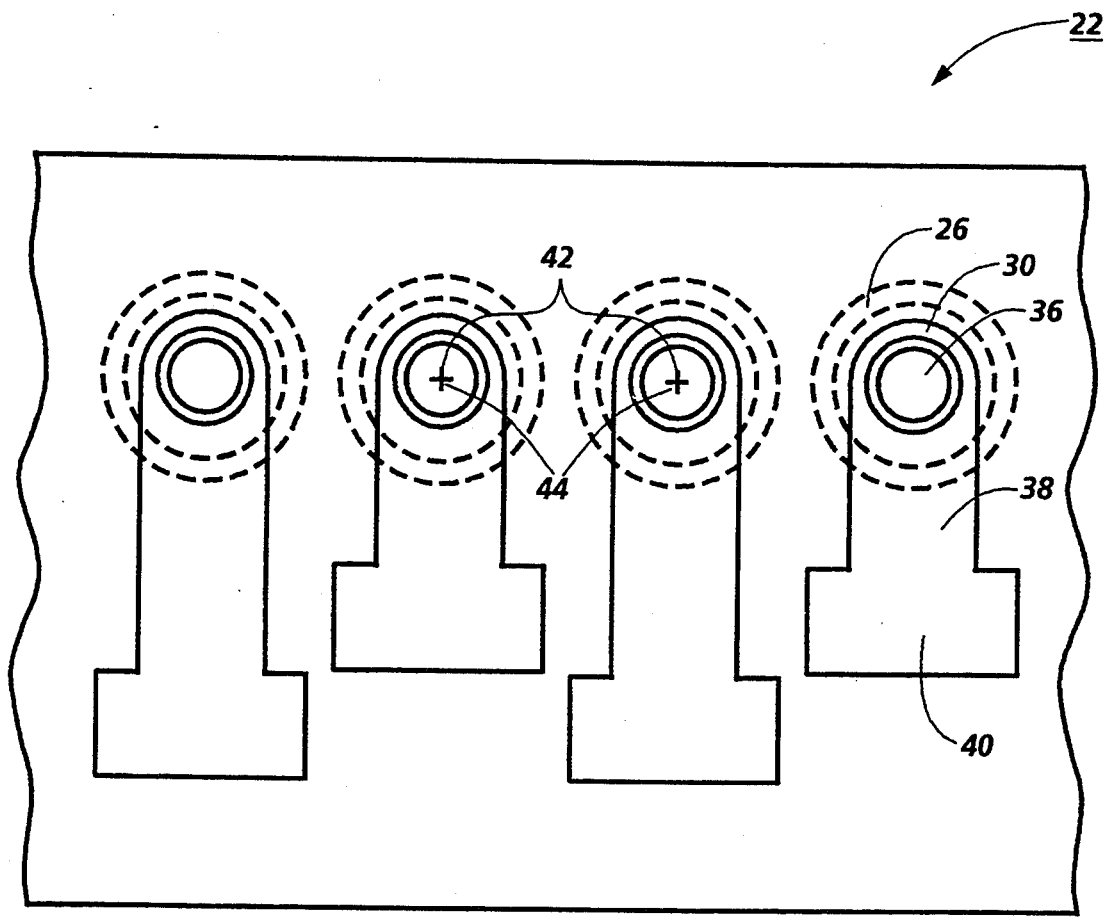
FIG. 2 is a schematic illustration of the top view of the LED array of FIG. 1.

FIG. 2 is the top view of the LED array of FIG. 1, showing the top surface 22 of the contact layer, with a linear array of circular emitter surface areas 36 of the LED light emitting areas where the light is emitted through the contact layer surface within the annular p-contacts 30. The annular ring of the p-contact is connected by a contact strip 38 to a power pad 40 to provide current to each individual LED element, making each LED element separately and independently addressable. The contact strips and attached power pads are along the same side of the top surface of the contact layer. The contact strip and power pad can be formed at the same time and by the same method as the p-contacts or by other means known to those of skill in the art.

The electrically insulating regions 26, as shown by the dotted line in the Figure, are also annular in shape, circumscribing the annular p-contacts and the circular emitter surface areas. The contact strip has been deposited over the insulating region to allow current to flow from the power pad to the p-contact.

With an approximate one micron diameter of the circular emitter surface areas 36, the spacing 42 from the center 44 of one individual LED element to the center 44 of the next LED element as measured from the emitter surface areas is approximately 2½ to 3 microns which provides for a high density of LEDs in the array. The impurity induced disordering provides accurate center to center spacing of the individual LED elements.

Figure 3:
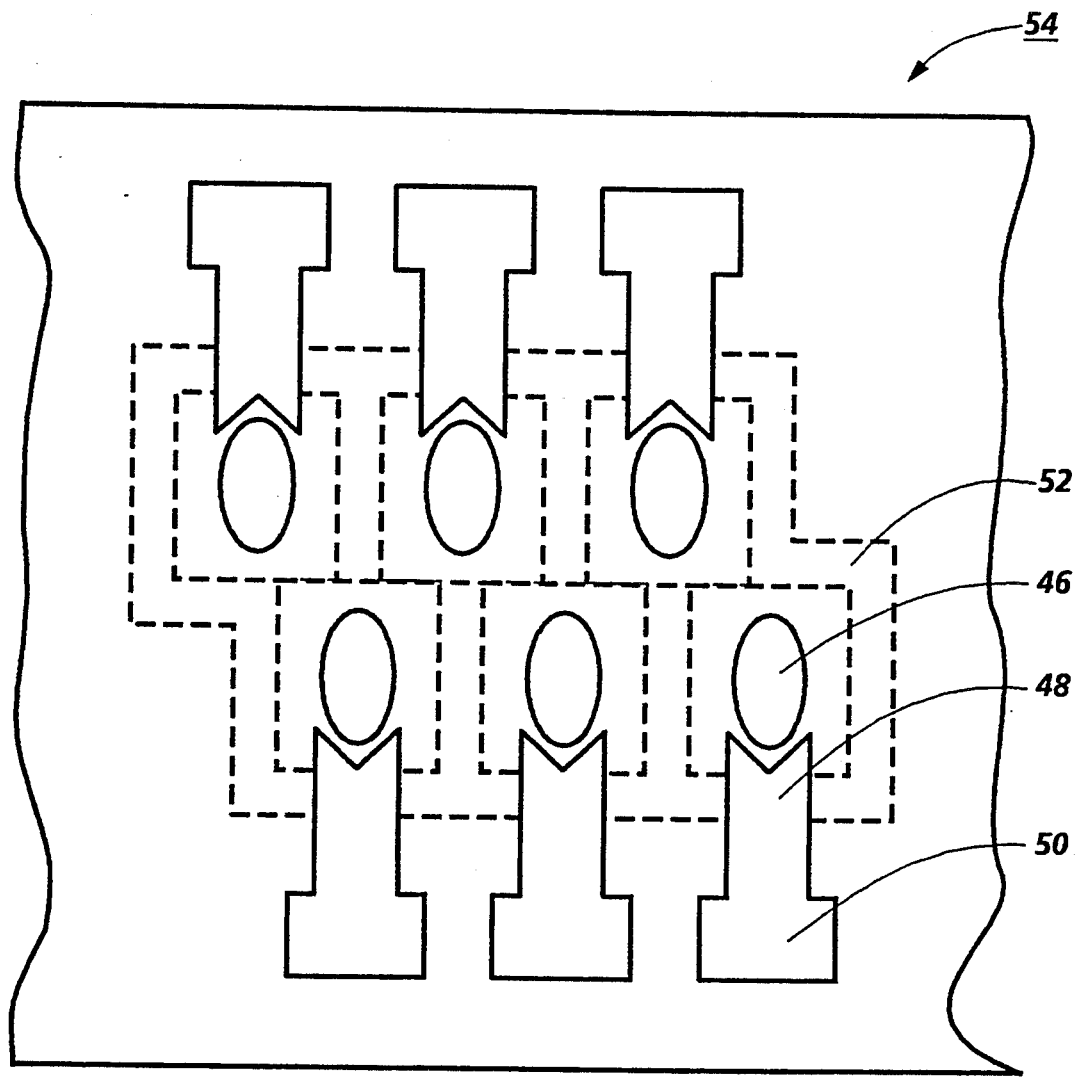
FIG. 3 is a schematic illustration of the top view of an alternate embodiment of a high density, independently addressable, surface emitting, semiconductor LED array formed according to this invention.

The circular nature of the emitter surface area, the annular shapes of the p-contact and the electrically insulating regions, and the linearity of the emitter surface areas are merely illustrative examples. As shown in FIG. 3, the emitter surface areas 46 can be elliptical with finger p-contact strips 48 connected to power pads 50. The finger contacts need only be on one side of the emitter surface area and within the square electrically insulating region 52 (in dotted lines). The finger contacts and power pads need not be on the same side of the contact layer 54.

The spacing from one individual LED element to the next individual LED element can be approximately 2 microns with the use of finger contacts as opposed to annular ring contacts. Similarly, the staggered or offset array of emitter surface areas in the Figure also provides a higher density of LED elements.

The shape of the emitter surface area is determined by the shape of the LED light emitting areas which can be circular, elliptical, square, parallelogramal, trapezoidal, triangular or any desired shape or size. The electrically insulating regions can also be of any shape and need not be the same shape as the p-contact. The electrically insulating regions can even overlap their edges.

The p-contact can also either follow the shape of the emitter surface area, or not follow the shape, or merely contact less than the perimeter of the shape of the emitter surface area. The only practical geometric concern is that the p-contact be within the electrically insulating region contacting the disordered region. The p-contact, strip contact and connected power pad can be pattern designed on the contact layer as is known in the semiconductor art.

The driver circuitry for the p-contacts and the necessary bonding pads can be fabricated on a silicon chip, not shown, placed flush against the top surface of the LED array. The silicon chip would be optically transparent to the light emission from the surface of the LED array or would have an appropriate hole or trench etched in the chip so as to permit the light transmission. Alternatively, electronic driver circuitry can be fabricated on the semiconductor LED array or separate and adjacent to the array or on or in the substrate of the semiconductor array.

Figure 4:
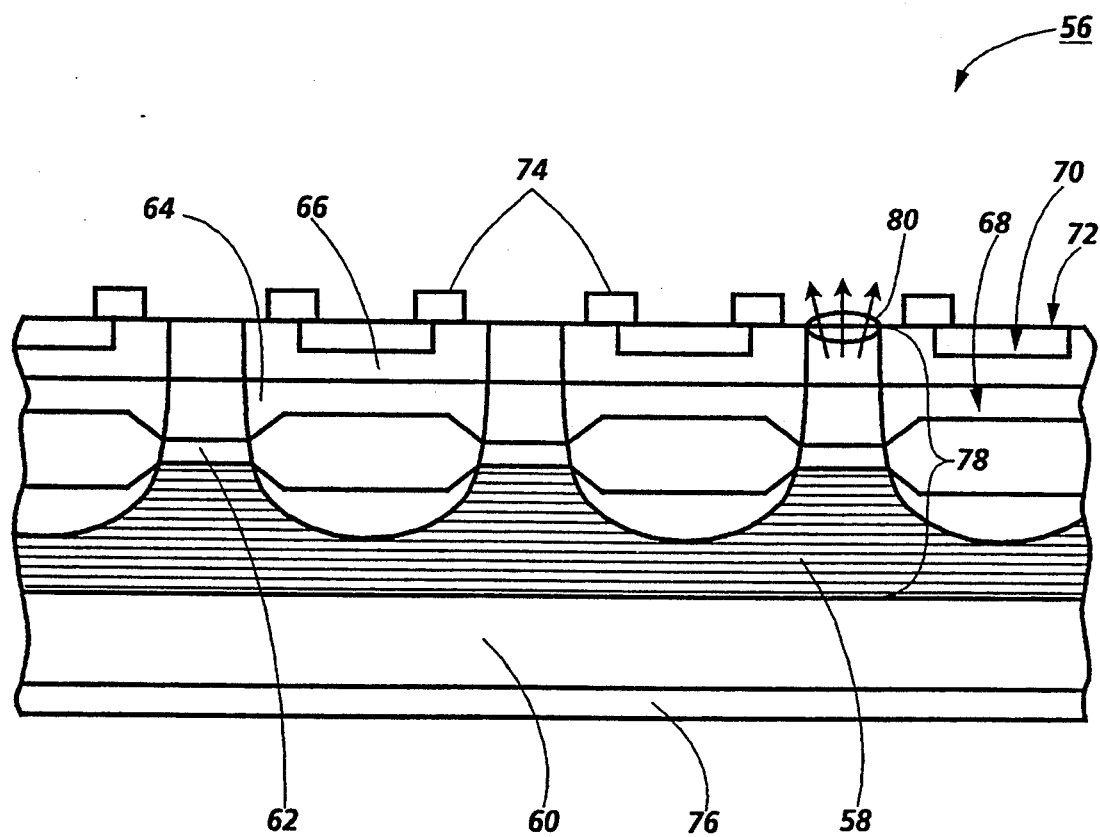
FIG. 4 is a schematic illustration of a side elevation of an enhanced, high density, independently addressable, surface emitting, semiconductor LED array with a DBR formed according to this invention.

In FIG. 4, enhanced LED array 56 is of identical structure to the LED array 10 of FIG. 1, except that the n-confinement layer 14 of FIG. 1 has been replaced by a distributed Bragg reflector (DBR) 58 in FIG. 4.

Thus, the LED array 56 comprises a substrate 60 of n-GaAs upon which is epitaxially deposited a n-DBR 58 of alternating layers of n-$Al_xGa_{1-x}$As and n-$Al_yGa_{1-y}$As where x  y, an active layer 62 of nondoped GaAs for providing light wave generation and propagation, a confinement layer 64 of p-$Al_zGa_{1-z}$As where z  x or y and a contact layer 66 of p-GaAs.

N-impurity induced disordered regions 68 are formed in the enhanced LED array 56 extending through portions of the contact layer 66, the p-confinement layer 64, the active layer 62 and the n-DBR 58. Electrically insulating regions 70 are formed in the disordered regions 68 through the top surface 72 of the contact layer 66. P-contacts 74 are formed on the contact layer 66 aligned with each disordered region 68 and a n-contact 76 is formed on the substrate 60.

Between the disordered regions 68 in the enhanced LED array 56 are the enhanced LED light emitting area 78 consisting of the nondisordered sections of the contact layer 66, the p-confinement layer 64, the active layer 62 and the n-DBR 58 The n-DBR is constructed to have a reflectivity as close to one as possible.

The light is emitted through the emitter surface area 80, substantially perpendicular to the top surface 72 of the contact layer 66. The n-DBR reflects the light being emitted by the optical cavity toward the n-side of the LED array back through the surface area on the p-side of the LED array, thus enhancing the amount of light emission of the LED array.

Typically, the enhanced LED array 56 has an operating current of about 10 milliamperes with an output power of about 60 microwatts.

Figure 5:
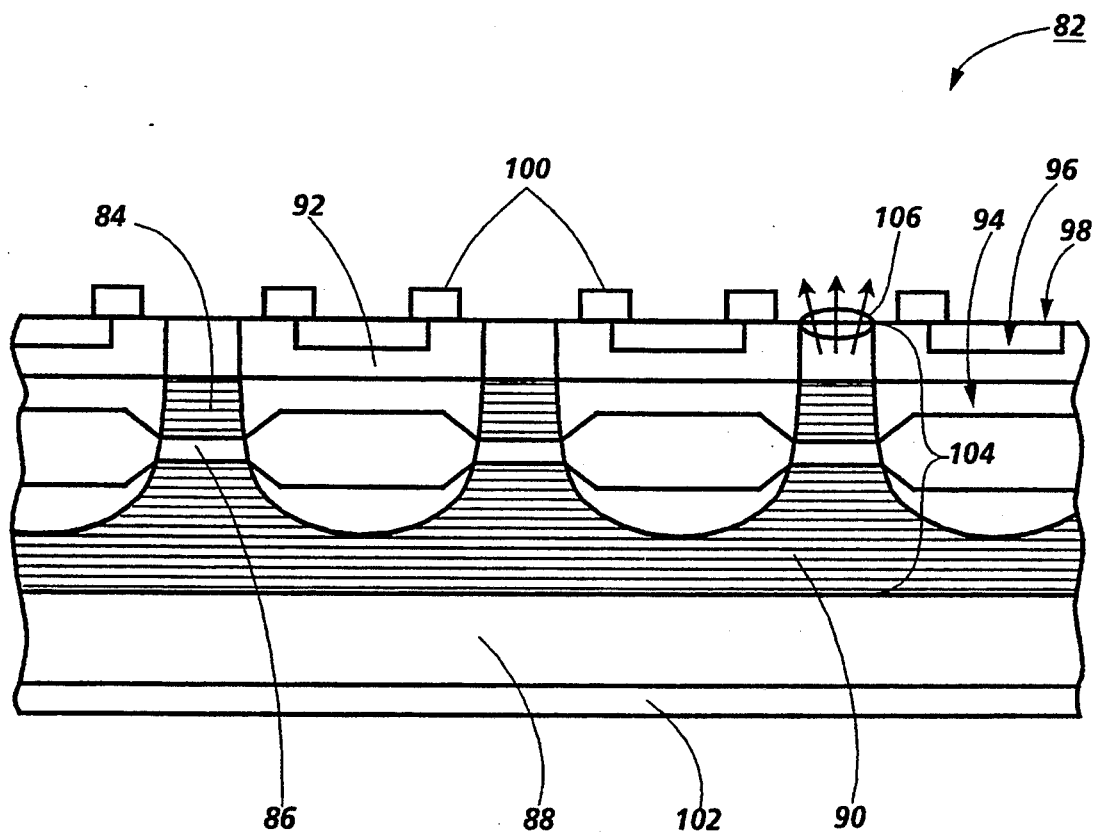
FIG. 5 is a schematic illustration of a side elevation of a high density, independently addressable, surface emitting, semiconductor laser array formed according to this invention.

In FIG. 5, laser array 82 is of identical structure to the enhanced LED array 56 of FIG. 4, except that the p-confinement layer 64 of FIG. 4 has been replaced by a distributed Bragg reflector (DBR) 84 in FIG. 5 and that active layer 62 of FIG. 4 which provides lightwave generation and propagation has been replaced by active layer 86 in FIG. 5 which provides lightwave generation and propagation under lasing conditions.

Thus, the laser array 82 comprises a substrate 88 of n-GaAs upon which is epitaxially deposited a n-DBR 90 of alternating layers of n-$Al_xGa_{1-x}$As and n-$Al_yGa_{1-y}$As where x  y, an active layer 86 of nondoped GaAs for providing light wave generation and propagation under lasing conditions, a p-DBR 84 of alternating layers of p-Al$_a$Ga$_{1-a}$As and p-Al$_b$Ga$_{1-b}$As where a b, and a contact layer 92 of p-GaAs.

N-impurity induced disordered regions 94 are formed in the laser array 82 extending through portions of the contact layer 92, the p-DBR 84, the active layer 86 and the n-DBR 90. Electrically insulating regions 96 are formed in the disordered regions 94 through the top surface 98 of the contact layer 92. P-contacts 100 are formed on the contact layer 92, aligned with each disordered region 94 and a n-contact 102 is formed on the substrate 88.

Between the disordered regions 94 in the laser array 82 are the laser optical cavity regions 104 consisting of the nondisordered sections of the contact layer 92, the p-DBR 84, the active layer 86 and the n-DBR 90. The n-DBR is constructed to have a reflectivity as close to one as possible while the p-DBR is constructed with a reflectivity close to one but less than that of the n-DBR.

The light is emitted through surface area 106, substantially perpendicular to the top surface 98 of the contact layer 92. Since the light is from a laser optical cavity, it is, of course, coherent. The emitted light can be either continuous wave or pulse.

Typically, the laser array 82 has a threshold current of 1 to 5 milliamperes and an operating current of about 10 milliamperes with an output power of about 1 to 3 milliwatts. Threshold currents of less than 1 milliampere are also possible for the laser array.

Figure 6:
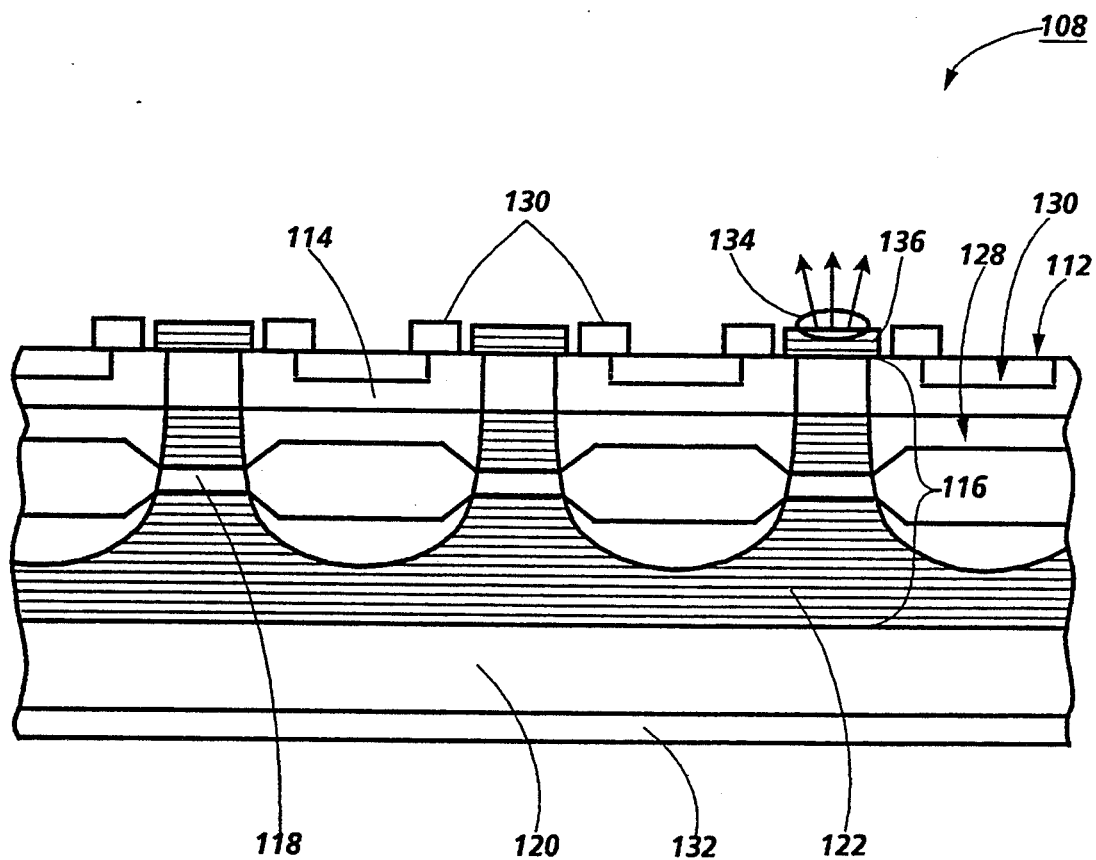
FIG. 6 is a schematic illustration of a side elevation of an alternate embodiment of a high density, independently addressable, surface emitting, semiconductor laser array with a dielectric mirror stack formed according to this invention.

In FIG. 6, laser array 108 is of identical structure to the enhanced LED array 56 of FIG. 4, except that a dielectric mirror stack 110 has been formed on the top surface 112 of the contact layer 114, aligned with and part of the optical cavity 116 in FIG. 6 which replaces the light emitting area 78 in FIG. 4 and that active layer 62 of FIG. 4 which provides lightwave generation and propagation has been replaced by active layer 118 in FIG. 6 which provides lightwave generation and propagation under lasing conditions.

Thus, the laser array 108 comprises a substrate 120 of n-GaAs upon which is epitaxially deposited a n-DBR 122 of alternating layers of n-Al$_x$Ga$_{1-x}$As and n-Al$_y$Ga$_{1-y}$As where x y, an active layer 118 of nondoped GaAs for providing light wave generation and propagation under lasing conditions, a confinement layer 124 of p-Al$_z$Ga$_{1-z}$As where z≠x or y and a contact layer 126 of p-GaAs.

N-impurity induced disordered regions 128 are formed in the laser array 108 extending through portions of the contact layer 126, the p-confinement layer 124, the active layer 118 and the n-DBR 122. Electrically insulating regions 130 are formed in the disordered regions 128 through the top surface 112 of the contact layer 114.

The dielectric mirror stack 110 may be formed on the top surface 112 of the contact layer 114 by vapor deposition. The stack 110 is composed of six alternating layers of quarter wavelength thick Al$_2$O$_3$ and Si, which will form an overall thickness of the dielectric mirror stack of approximately 5 thousand angstroms. The stack is aligned with the nondisordered section of the contact layer 114. P-contacts 130 are formed on the contact layer 126 aligned with each disordered region 128 and a n-contact 132 is formed on the substrate 120.

Between the disordered regions 68 in the enhanced LED array 56 are the laser optical cavity 116 consisting of the dielectric mirror stack 110 and the nondisordered sections of the contact layer 126, the p-confinement layer 124, the active layer 118 and the n-DBR 122. The n-DBR is constructed to have a reflectivity as close to one as possible while the dielectric mirror stack is constructed with a reflectivity close to one but less than that of the n-DBR.

The light is emitted through the emitter surface area 134, substantially perpendicular to the top surface 136 of the dielectric mirror stack 110. Since the light is from a laser optical cavity, it is, of course, coherent. The emitted light can be either continuous wave or pulse.

The dielectric stack can be deposited directly on the second confinement layer without the intervening contact layer either through masking during the deposition of the contact layer or etching after the deposition of the contact layer. The dielectric stack will thus be directly at the emission end of the light emitting diode optical cavity or the laser cavity.

In the alternative, the dielectric mirror stack is generally composed of alternating layers of two different materials that also differ in refractive index, as is known in the art. Other materials would include alternating layers of GaAs and GaAlAs or alternating layers of SiO$_2$ and TiO$_2$.

The emitter surface areas of the various surface emitting LED, enhanced LED and laser array embodiments in this present application can be etched to form Fresnel lenses to diverge, collimate, focus or otherwise optically modify the emitted light. A micro lens array can be positioned adjacent to the surface emitting areas to similarly optically modify the emitted light. A transparent refractive layer can be deposited between the p-confinement layer or p-DBR and the contact layer to diverge the emitted light. The semiconductor surface emitting laser/light emitting diode arrays can also be formed into two-dimensional arrays.

Figure 7:
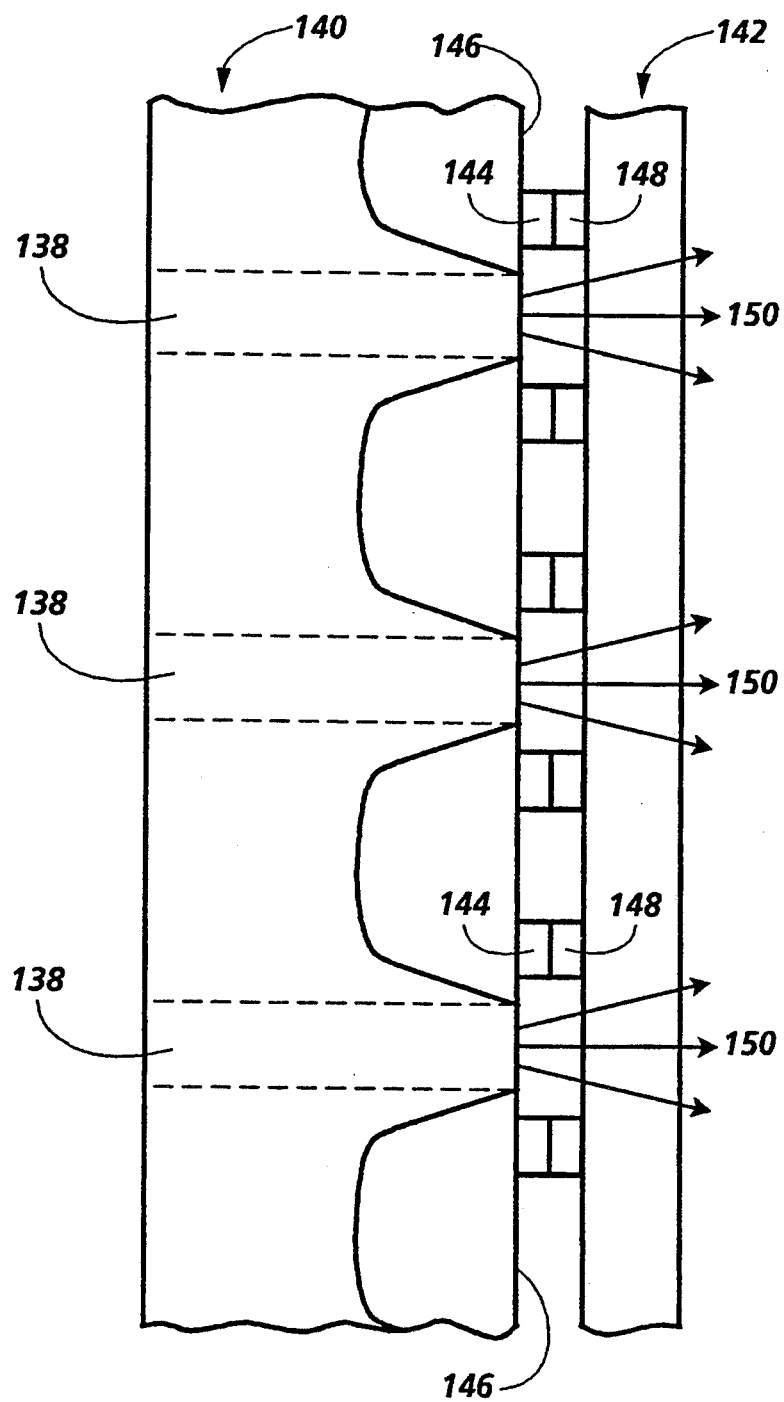
FIG. 7 is a schematic illustration of a side elevation of a light emitting element array and a driver circuit substrate to modulate the emission of the light from the array formed according to this invention.

The individual light emitting elements 138 of the array 140 in FIG. 7 are separately and independently addressable through a driver circuit substrate 142 pressed or otherwise held closely adjacent to the array to maintain the electrical interface between the p-contacts 144 of the top surface 146 of the light emitting array 140 and the electrode contacts 148 of the driver circuit substrate.

The light emitting element array 138 can be the LED array 10 of FIG. 1, the enhanced LED array 56 of FIG. 4, the laser array 82 of FIG. 5, or the laser array 108 of FIG. 6.

The electrode contacts 148 can be defined by suitably patterning an electrically conductive, metallization layer, which is deposited on and incorporated in a LSI or a VLSI silicon integrated circuit, which forms the driver circuit substrate 142. A gallium arsenide integrated circuit might also be used.

This construction allows the driver circuit to modulate the emission of the light 150 from the array by separately and independently addressing the individual light emitting elements 138.

The driver circuit substrate 142 would be optically transparent to the light emission 150 from the top surface 146 of the light emitting array 140 or would have an appropriate hole or trench would be etched in the driver circuit substrate 142 so as to permit the unimpeded transmission of the light.

Alternatively, electronic driver circuitry can be fabricated on the top surface of the array 140, or separate and adjacent to the array, or on or in the substrate of the array.

It is a requirement in the practice of this invention that the multiple light emitting elements of the array be sufficiently close to one another but not operate in a phase locked condition. This is in order to ensure that the emission of two or more light emitting elements comprising the array may be independently addressable in spite of the high density required for focus to an image plane, such as in the case of a photoreceptor surface of a printer, to form a sufficiently dense array of pixels required for good printing resolution.

The disordering between adjacent light emitting elements prevents phase locking between adjacent emitters due to overlap of evanescent optical wave extending between adjacent emitters. The disordering regions provide both optical confinement of this wave as well as carrier confinement to the individual light emitting elements, so that the individual light emitting elements may be closely spaced, such as on 2 to 5 micron centers, without being optically coupled to one another.

Each of the light emitting elements is individually addressable through its individual contacts. Therefore, to print an image, directly encoded data samples for successive lines of the image are sequentially applied to the contacts. The modulator driving circuit supplies the directly encoded data samples for the individual light emitting elements to emit light for the adjacent picture elements or pixels of successive lines of an image formed on the photosensitive recording medium.

Referring to FIG. 8A and 8B, there is disclosed an opto-electronic line printer 152 having a modulated LED or laser array 154 for generating a modulated light beam which is collected, magnified and focused by imaging optics 156 for printing an image on a photosensitive recording medium 158. As shown, the recording medium 158 is a photoconductively coated drum 160 which is rotated (by means not shown) in the direction indicated by arrow 160A. Nevertheless, it will be evident that there are other xerographic and non-xerographic recording media that could be used, including photoconductively coated belts and plates, as well as photosensitive films and coated papers. Thus, in the generalized case, the recording medium 158 should be visualized as being a photosensitive medium which is exposed while advancing in a cross line or line pitch direction relative to the modulated array 154.

The modulated array 154 in FIG. 8 comprises an optically emissive array with a plurality of individually addressable light emitting elements, as illustrated by the light emitting array 140 of FIG. 7, coupled with the appropriate modulator driving circuit, as illustrated by the circuit 142 of FIG. 7. The light emitting elements can be either light emitting diodes or lasers.

Reference is now made to FIGS. 8A and 8B for the imaging optics 156 for collecting, magnifying and focusing the emitted light beam 162 from the modulated array 154 for printing an image on the photosensitive recording medium 158. In the embodiment of FIG. 8, the imaging optics 156 comprise a toric lens 164 optically aligned between the modulated array 154 and the photosensitive recording medium 158.

The divergent light 162 from the light emitting elements of the modulated array 154 is focused in the sagittal direction by toric lens 164 in FIG. 8A to a wedge-shaped configuration 166 forming a focussed line image 168 onto the photosensitive recording medium 158. The divergent light 162 is magnified in the tangential direction by toric lens 164 in FIG. 8B to a line 168 along the photosensitive recording medium 158. The focussed light image is composed of spots of light. Each individual spot is the output emitted light from each individual light emitting element of the high density array magnified by the lens to form the spots per inch of the line along the photosensitive recording medium.

The individual light emitting elements of the high density array emit light which diverges so that the light from the individual light emitting elements may overlap past a certain distance. The magnification from the imaging optics prevents this overlap or interference by directing and focussing each individual spot of light from each individual light emitting elements to a separate location along the line along the photosensitive recording medium to form the focussed light image.

The magnification is also used to expand the closely spaced light from the high density light emitter array to the more broader, required spots per inch along the line 168 on the photosensitive recording medium 158. The lens 164 is a relatively simple and inexpensive component and may be formed of plastic.

In the embodiment of FIG. 9, the imaging optics 170 of the opto-electronic line printer 171 comprises a cylindrical lens 172 and a toric lens 174, rather than the single lens 164 of the embodiment of FIG. 8. Thus, the modulated array 176 emits a divergent light 178 which is collected in the sagittal direction by the cylindrical lens 172 and then focused by toric lens 174 to a wedge-shaped configuration 180 forming a focussed line image 182 onto the photosensitive recording medium 184 in FIG. 9A. In FIG. 9B, the modulated array 176 emits a divergent light 178 which is magnified in the tangential direction by the cylindrical lens 172 and then passes uneffected through the plano portion of the toric lens 174 to a line 182 on the photosensitive recording medium 184.

Alternately, the two lenses 172 and 174 of the imaging optics 170 of the embodiment of FIG. 9 can have different optical properties. The back lenses 174 can further magnify the divergent beam in the tangential direction from the already magnifying front lens 172. The front lens 172 can collimate the beam in the sagittal and tangential directions with the back lens 174 focusing the collimated beam in the sagittal direction to a wedge-shaped focus on the photosensitive recording medium while in the tangential direction, the collimated beam would be magnified onto a line on the photosensitive recording medium. In any configuration, the lenses 172 and 174 are relatively simple and inexpensive components and may be formed of plastic.

A more efficient collection of light from the modulated array is disclosed in FIGS. 10A and 10B. In order to collect more light or power from the modulated array 186 of the opto-electronic line printer 187, a multiple lens system 188, similar to a microscope objective lens system, collects the divergent light beam 190 from the modulated array 186. In FIG. 10A, the divergent beam 190 from the modulated array 186 is collected in the sagittal direction by the multiple lens system 188, passes through the plano portion of the cylindrical lens 192 and then focused by the toric lens 194 to a wedge-shaped configuration 196 forming a focussed line image 198 onto the photosensitive recording medium 200. In FIG. 10B, the divergent beam 190 from the modulated array 186 is collected in the tangential direction by the multiple lens system 188, focussed to a virtual point 202 by the cylindrical lens 192 which is then refocused as a diverging beam and collected by the toric lens 194 to form a line 198 along the photosensitive recording medium 200.

The imaging optics 204 comprises the multiple lens system 188, the cylindrical lens 192 and the toric lens 194.

The lens system of FIG. 10A and 10B provides for collection of more light from modulated array 186 in utilizing the multiple lens system 188. Thus, an LED source with less power output may qualify for use with the lens system of Figure 10A and 10B. The lens systems of FIG. 8 and 9 do not utilize such a light collection system, thereby eliminating this expense, but will require a higher power LED source to provide the same level of light intensity required for the opto-electronic line printer.

Figure 11:
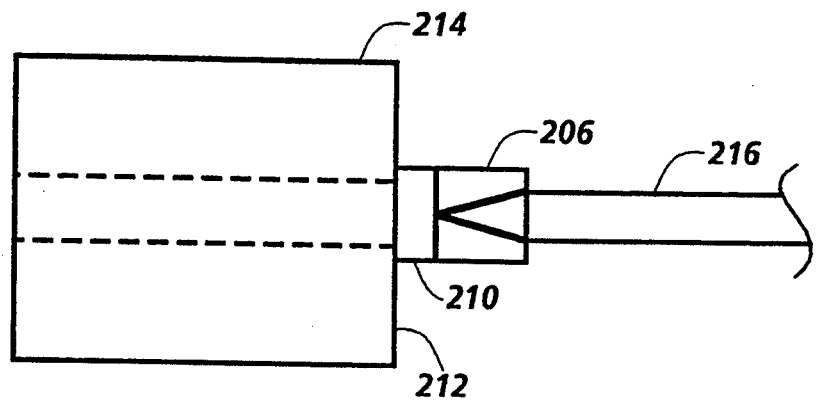
FIG. 11 is a schematic illustration of an alternate embodiment of the imaging optics for an opto-electronic line printer formed according to this invention.
Figure 12:
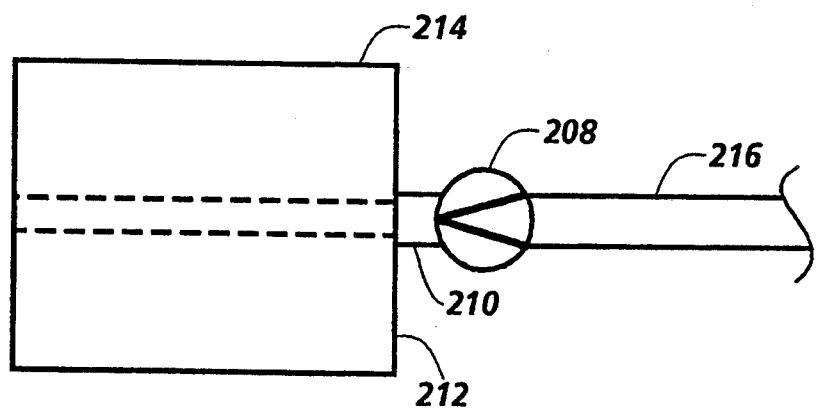
FIG. 12 is a schematic illustration of another alternate embodiment of the imaging optics for an opto-electronic line printer formed according to this invention.

As an alternative to the single lens of the imaging optics of FIG. 8 or the front lenses for the imaging optics of FIGS. 9 and 10, an array of selfoc lenses 206 of FIG. 11 or a microlenses 208 of FIG. 12 may be secured by adhesive or epoxy 210 to the front facet 212 of modulated array 214 to collimate the emitted beam 216. Each lens is aligned with a light emitting element. The front facet may be either the front facet of the light emitting array, the front facet of the modulator driving circuit, or the front facet of the light emitting array itself with the array of lens fitting within the modulator driving circuit. Microlens 208 may be a ball lens, a hemispherical lens or may be a cylinder lens.

Other alloy systems may be used to fabricate LED sources with visible emission wavelengths, e.g., GaAlAs/InGaP/GaAlAs or AlGaInP/InGaP/AlGaInP.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An opto-electronic line printer comprising:
    a high density, surface emitting, semiconductor light emitting diode array including
    a first semiconductor confinement layer deposited on a substrate, said first confinement layer and said substrate having an identical conductivity type,
    an active semiconductor layer deposited on said first confinement layer, said active layer providing lightwave generation and propagation,
    a second semiconductor confinement layer deposited on said active layer, said second confinement layer having an opposing conductivity type to said first confinement layer and said substrate,
    a semiconductor contact layer deposited on said second confinement layer, said contact layer and said second confinement layer having an identical conductivity type,
    disordered regions extending through said contact layer, said second confinement layer, said active layer and at least partially through said first confinement layer, said disordered regions having an identical opposing conductivity type to said first confinement layer and said substrate,
    contacts formed on said contact layer, one of said contacts aligned with each of said disordered regions,
    at least one contact formed on said substrate, and
    optical cavities formed between said disordered regions, so that current injected between one of said contacts on said contact layer and said at least one contact on said substrate will cause light emission from one of said optical cavities through the surface of said contact layer,
    means for modulating said light emission from said light emitting diode array,
    a recording medium, and
    optical means aligned between said light emitting diode array and said recording medium for imaging said modulated light emission from said light emitting diode array onto said recording medium.

2. The opto-electronic line printer of claim 1 wherein said optical means is a single lens.

3. The opto-electronic line printer of claim 1 wherein said optical means is a multiple lens system.

4. An opto-electronic line printer comprising:
    a high density, surface emitting, semiconductor light emitting diode array including
    alternating semiconductor layers deposited on a substrate, said alternating layers forming a distributed Bragg reflector (DBR), said DBR and said substrate having an identical conductivity type,
    an active semiconductor layer deposited on said DBR, said active layer providing lightwave generation and propagation,
    a semiconductor confinement layer deposited on said active layer, said confinement layer having an opposing conductivity type to said DBR and said substrate,
    a semiconductor contact layer deposited on said confinement layer, said contact layer and said confinement layer having an identical conductivity type,
    disordered regions extending through said contact layer, said confinement layer, said active layer and at least partially through said DBR, said disordered regions having an identical conductivity type to said DBR and said substrate,
    contacts formed on said contact layer, one of said contacts aligned with each of said disordered regions,
    at least one contact formed on said substrate, and
    optical cavities formed between said disordered regions, so that current injected between one of said contacts on said contact layer and said at least one contact on said substrate will cause light emission from one of said optical cavities through the surface of said contact layer,
    means for modulating said light emission from said light emitting diode array,
    a recording medium, and
    optical means aligned between said light emitting diode array and said recording medium for imaging said modulated light emission from said light emitting diode array onto said recording medium.

5. The opto-electronic line printer of claim 4 wherein said optical means is a single lens.

6. The opto-electronic line printer of claim 4 wherein said optical means is a multiple lens system.

7. An opto-electronic line printer comprising:
    a high density, surface emitting, semiconductor laser array including
    alternating semiconductor layers deposited on said substrate, said alternating layers forming a first distributed Bragg Reflector (DBR), said first DBR and said substrate having an identical conductivity type,
    an active semiconductor layer deposited on said first DBR, said active layer providing lightwave generation and propagation under lasing conditions, alternating semiconductor layers deposited on said active layer, said alternating layers forming a second distributed Bragg Reflector (DBR), said second DBR having an opposing conductivity type to said first DBR and said substrate, a semiconductor contact layer deposited on said second DBR, said contact layer and said second DBR having an identical conductivity type, disordered regions extending through said contact layer, said second DBR, said active layer and at least partially through said first DBR, said disordered regions having an identical conductivity type to said first DBR and said substrate, contacts formed on said contact layer, one of said contacts aligned with each of said disordered regions, at least one contact formed on said substrate, and optical cavities formed between said disordered regions, such that current injected between one of said contacts on said contact layer and said at least one contact on said substrate will cause light emission from one of said optical cavities through the surface of said contact layer, means for modulating said light emission from said laser array, a recording medium, and optical means aligned between said laser array and said recording medium for imaging said modulated light emission from said laser array onto said recording medium.

8. The opto-electronic line printer of claim 7 wherein said optical means is a single lens.

9. The opto-electronic line printer of claim 7 wherein said optical means is a multiple lens system.

10. An opto-electronic line printer comprising:

a high density, surface emitting, semiconductor laser array including alternating semiconductor layers deposited on a substrate, said alternating layers forming a distributed Bragg reflector (DBR), said DBR and said substrate having an identical conductivity type, an active semiconductor layer deposited on said DBR, said active layer providing lightwave generation and propagation, a semiconductor confinement layer deposited on said active layer, said confinement layer having an opposing conductivity type to said DBR and said substrate, a semiconductor contact layer deposited on said confinement layer, said contact layer and said confinement layer having an identical conductivity type, disordered regions extending through said contact layer, said confinement layer, said active layer and at least partially through said DBR, said disordered regions having an identical conductivity type to said DBR and said substrate, dielectric mirrors formed on said nondisordered contact layer, contacts formed on said contact layer, one of said contacts aligned with each of said disordered regions, at least one contact formed on said substrate, and optical cavities formed between said disordered regions, so that current injected between one of said contacts on said contact layer and said at least one contact on said substrate will cause light emission from one of said optical cavities through the surface of said dielectric mirrors, means for modulating said light emission from said laser array, a recording medium, and optical means aligned between said laser array and said recording medium for imaging said modulated light emission from said laser array onto said recording medium.

11. The opto-electronic line printer of claim 10 wherein said optical means is a single lens.

12. The opto-electronic line printer of claim 10 wherein said optical means is a multiple lens system.

* * * * *